(12) United States Patent
Sinclair et al.

(10) Patent No.: US 8,436,318 B2
(45) Date of Patent: May 7, 2013

(54) APPARATUS FOR CONTROLLING THE TEMPERATURE OF AN RF ION SOURCE WINDOW

(75) Inventors: Frank Sinclair, Quincy, MA (US);
Costel Biloiu, Rockport, MA (US);
Bon-Woong Koo, Andover, MA (US);
Victor Benveniste, Lyle, WA (US);
Shardul Patel, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 289 days.

(21) Appl. No.: 12/754,258

(22) Filed: Apr. 5, 2010

(65) Prior Publication Data
US 2011/0240876 A1 Oct. 6, 2011

(51) Int. Cl.
*H01J 27/00* (2006.01)

(52) U.S. Cl.
USPC .............. 250/423 R; 315/111.21; 315/111.31

(58) Field of Classification Search .............. 25/423 R, 25/424, 492.1, 492.2, 492.21, 492.3, 281, 25/282, 288; 315/111.21, 111.31, 111.81
See application file for complete search history.

(56) References Cited

U.S. PATENT DOCUMENTS

| | | | | |
|---|---|---|---|---|
| 5,068,534 A * | 11/1991 | Bradshaw et al. | ............ | 250/288 |
| 5,089,746 A * | 2/1992 | Rosenblum et al. | ..... | 315/111.81 |
| 5,383,019 A * | 1/1995 | Farrell et al. | ................... | 356/316 |
| 6,094,012 A * | 7/2000 | Leung et al. | ............. | 315/111.81 |
| 6,308,654 B1 * | 10/2001 | Schneider et al. | .......... | 118/723 I |
| 6,518,195 B1 * | 2/2003 | Collins et al. | ................. | 438/723 |
| 6,815,697 B2 * | 11/2004 | Sano et al. | ................ | 250/492.21 |
| 7,393,761 B2 * | 7/2008 | Wajda et al. | .................. | 438/473 |
| 7,402,816 B2 * | 7/2008 | Renau et al. | ........... | 250/396 ML |
| 7,609,003 B2 * | 10/2009 | Horsky et al. | ............. | 315/111.81 |
| 7,771,562 B2 * | 8/2010 | Brcka | ....................... | 156/345.48 |
| 8,072,149 B2 * | 12/2011 | Cho et al. | ................. | 315/111.81 |
| 2006/0169912 A1 * | 8/2006 | Renau et al. | ........... | 250/396 ML |
| 2006/0174834 A1 | 8/2006 | Long et al. | | |
| 2007/0170867 A1 * | 7/2007 | Persing et al. | ........... | 315/111.21 |
| 2007/0178679 A1 * | 8/2007 | Hatem et al. | .................. | 438/514 |
| 2009/0008577 A1 * | 1/2009 | Walther | .................... | 250/492.21 |
| 2009/0084988 A1 * | 4/2009 | Blake et al. | .............. | 250/492.21 |
| 2009/0104761 A1 | 4/2009 | Jeon et al. | | |
| 2009/0236315 A1 | 9/2009 | Willwerth et al. | | |
| 2009/0236547 A1 * | 9/2009 | Huang et al. | ............. | 250/492.21 |
| 2009/0321631 A1 * | 12/2009 | Smick et al. | .................. | 250/282 |

FOREIGN PATENT DOCUMENTS

EP    0838841 A2    4/1998

* cited by examiner

*Primary Examiner* — Robert Kim
*Assistant Examiner* — Jason McCormack

(57) ABSTRACT

An RF ion source utilizing a heating/RF-shielding element for controlling the temperature of an RF window and to act as an RF shielding element for the RF ion source. When the heating/RF shielding element is in a heating mode, it suppresses formation of unwanted deposits on the RF window which negatively impacts the transfer of RF energy from an RF antenna to a plasma chamber. When the heating/RF-shielding element is in a shielding mode, it provides an electrostatic shielding for the RF ion source.

18 Claims, 5 Drawing Sheets

APPARATUS FOR CONTROLLING THE TEMPERATURE OF AN RF ION SOURCE WINDOW

BACKGROUND OF THE INVENTION

1. Field of the Invention

Embodiments of the invention relate to the field of semiconductor device fabrication. More particularly, the present invention relates to an apparatus for controlling the temperature of an RF window in an RF ion source thereby suppressing the formation of deposits thereon.

2. Discussion of Related Art

Ion implantation is a process used to dope ions into a work piece or target substrate. One type of ion implantation is used to implant impurity ions during the manufacture of semiconductor substrates to obtain desired electrical device characteristics. An ion implanter generally includes an ion source chamber which generates ions of a particular species, a series of beam line components to control the ion beam and a platen to secure the target substrate that receives the ion beam. These components are housed in a vacuum environment to prevent contamination and dispersion of the ion beam. The beam line components may include a series of electrodes to extract the ions from the source chamber, a mass analyzer configured with a particular magnetic field such that only the ions with a desired mass-to-charge ratio travel through the analyzer, and a corrector magnet to provide a ribbon beam which is directed to the platen orthogonally with respect to the ion beam to implant the ions into the target substrate. The ions lose energy when they collide with electrons and nuclei in the substrate and come to rest at a desired depth within the substrate based on the acceleration energy. The depth of implantation into the substrate is based on the ion implant energy and the mass of the ions generated in the source chamber. Typically, arsenic or phosphorus may be doped to form n-type regions in the substrate and boron, gallium or indium are doped to create p-type regions in the substrate.

Various types of ion sources may be employed based on the type of plasma desired as well as the associated beam profile for implantation in the target substrate. One type of ion source is a hot-cathode ion source that utilizes an indirectly heated cathode (IHC) as the heating element to ionize a feed gas introduced into the chamber to form charged ions and electrons (i.e. plasma). The feed gas includes element(s) to be implanted into the target substrate. Another type of ion source is an RF plasma source which utilizes an RF coil to excite a feed gas supplied to the chamber. The current in the RF coil can be adjusted to control the density of the generated ions extracted from the chamber.

An RF ion source can accommodate large-size ion beam extractions and typically has a longer operational life as compared to an IHC source since RF ion sources do not utilize a hot cathode element. However, RF ion sources are typically operated at relatively low temperatures and are limited for use with inert gases and fluorides. This is due to the fact that when hydrides are used in RF ion sources, the hydrides cause deposits therein. These deposits reduce the RF power coupling efficiency to the feed gas in the source chamber resulting in low plasma density, unstable discharge, glitching and source failures. Glitching is a sudden transient in the beam current that can adversely affect precise dose control and dose uniformity of the implanted species on a target substrate. This may cause unstable ion source operation and beam extraction thereby compromising the desired beam profile which negatively impacts manufacturing throughput.

For certain RF ion source applications, using fluorides rather than hydrides have associated disadvantages. For example, using fluorides as feed gases such as Boron Trifluoride (BF3) result in low fractionation of the desired ion species such as Boron (B) based on the composition of the supplied feed gas. Low fractionation compromises the production of the desired ion species at a given extraction condition from the source chamber. In contrast, using hydrides as a feed gas produces higher fractionation of the desired ion species. However, hydrides tend to leave deposit materials typically on cold surfaces. Suppression of these deposits when using hydride gases in an RF ion source may be accomplished by proper heating of the source chamber as well as the extraction electrodes used to extract the ion beam from the source. In particular, by raising the window temperature in an RF ion source, deposition can be suppressed and also easily removed from the RF window via ion bombardment. Thus, there is a need to provide a temperature controlled RF ion source that suppresses unwanted depositions for stable, glitch-free ion source operation.

In addition, electrostatic shielding (typically referred to as "Faraday Shield") reduces the capacitive coupling of the high voltage RF antenna to the plasma within the chamber for RF ion sources. This is especially the case when the antenna is located outside of the RF window, in which capacitive coupling can cause RF window material sputtering and also poor coupling with the plasma. The electrostatic shield is typically an electrically conductive plate with multiple-shaped slots, located in between RF antenna and RF window. The electrostatic shield suppresses capacitive coupling of the RF power into the plasma, which is much less effective in plasma generation than inductive coupling. Instead, the electrostatic shield allows only inductive components to penetrate through the shielding thus accommodating the generation of high-density plasmas. However, previous RF ion sources, that include electrostatic shields are configured to only provide this shielding function. Thus, there is an additional need to provide an RF ion source wherein the heating elements may have the dual function of ion source heating and electrostatic shielding.

SUMMARY OF THE INVENTION

Exemplary embodiments of the present invention are directed to an RF ion source. In an exemplary embodiment, an apparatus is disclosed for suppressing the formation of deposits on an RF window and providing electrostatic shielding in an RF ion source. An RF ion source comprises a plasma chamber, an RF antenna, an RF window and a heating/RF-shielding element. The RF antenna is configured to provide RF energy to the plasma chamber. The RF window is disposed between the plasma chamber and the RF antenna. The RF window has a surface that is exposed to an interior of the plasma chamber. The heating/RF-shielding element is disposed between the surface of the RF window and the RF antenna. The heating/RF-shielding element has a first mode of operation configured to heat at least a portion of the RF window to suppress the formation of deposits on the interior surface of said RF window and a second mode of operation configured to provide an electrostatic shield for the high-density plasma ion source operation.

In another exemplary embodiment, an RF ion source includes a plasma chamber, an RF antenna, an RF window, a heating/RF shielding element and an outer window insulator. The RF antenna is configured to provide RF energy to the plasma chamber. The RF window is disposed between the plasma chamber and the RF antenna where the RF window has a surface exposed to an interior of the plasma chamber. The heating/RF shielding element is disposed between the surface of the RF window and the RF antenna. The heating/RF shielding element has a first mode of operation configured to heat at least a portion of the RF window to suppress the formation of deposits on the surface of the RF window and a second mode of operation configured to provide an electrostatic shield for the ion source. The outer window insulator is disposed between the heating/RF shielding element and the RF antenna. The insulator insulates the plasma chamber at a vacuum from ambient air.

DESCRIPTION OF EMBODIMENTS

Figure 1:
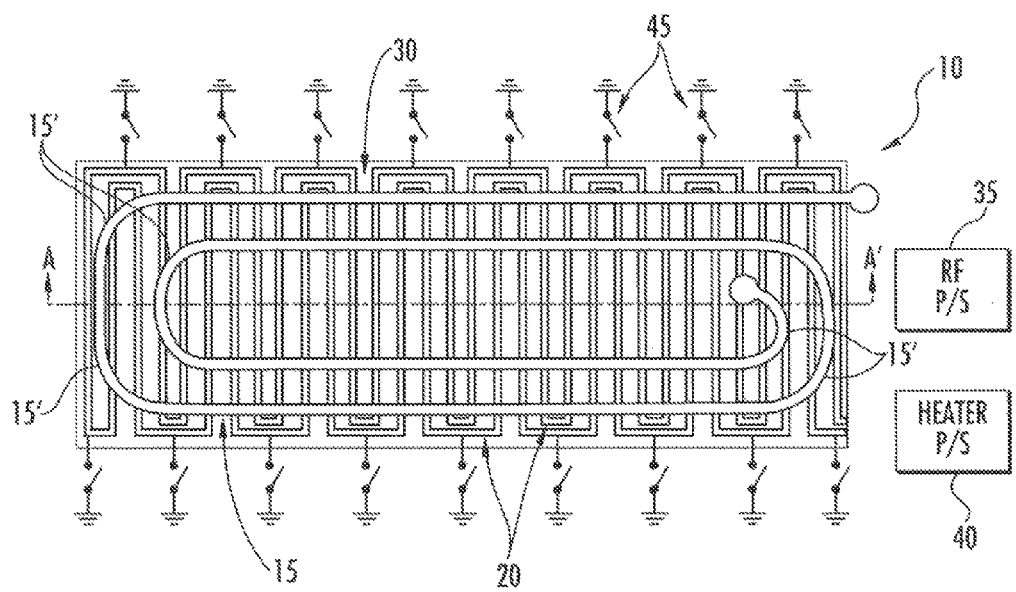
FIG. 1 is a top plan view of an exemplary RF ion source chamber in accordance with an embodiment of the present disclosure.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a top plan view of an exemplary RF ion source 10 in accordance with the present disclosure. Because an RF ion source is typically larger than other ion sources such as, for example, an IHC ion source, controlling the temperature of the RF window is important to avoid unwanted deposits from impacting the transfer of RF energy from an RF antenna to the feed gas in the plasma chamber generating the desired plasma. The present disclosure is applicable to Inductively Coupled Plasma (ICP) reactors and can be extended to spiral and cylindrical geometries.

Figure 2:
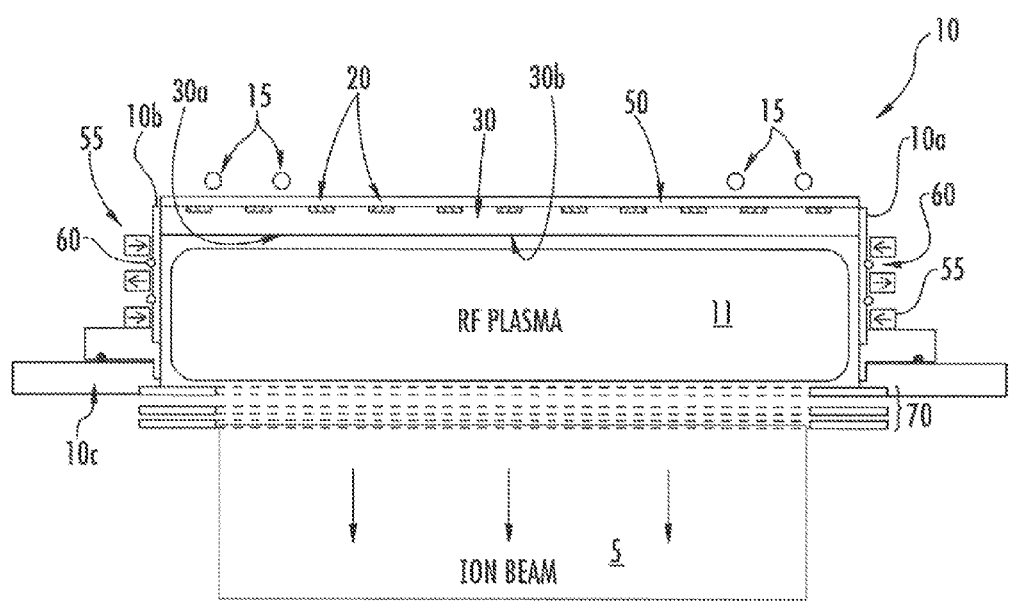
FIG. 2 is a cross-sectional view taken along lines A-A of FIG. 1 in accordance with an embodiment of the present disclosure.

An RF antenna 15 is disposed above heating/RF-shielding element 20 in a loop arrangement having a plurality of curved portions 15' to provide an effective RF energy coupling to the feed gas in the plasma chamber. The heating/RF-shielding element 20 is provided in a serpentine configuration above the RF window 30 and serves a dual purpose in that it is used as a heating element and also as an RF shielding element. Although a serpentine configuration is shown in FIG. 1, alternative arrangements may also be employed above the RF window 30. An RF power source 35 is configured for connection to RF antenna 15 and a power supply 40 is configured for connection to the heating/RF-shielding element 20. A plurality of switches 45, when closed, connect the heating/RF-shielding elements to ground. The various connection configurations are described in more detail below with reference to FIGS. 3-5. As mentioned above, deposits may form on the surface of the RF window 30 that forms the interface with the chamber. If these deposits are electrically conductive, it negatively impacts the RF energy coupling from antenna 15 to the feed gas contained in the source plasma chamber (as shown in FIG. 2). If the deposits in the RF window are electrically non-conductive, whether uniform or non-uniform, then energy can still be transferred to the RF plasma in the chamber, but this energy transfer is less effective and can be non-uniform. This results in variations in plasma generation of the feed gas within the chamber and consequently non-uniform and unstable source operation. Thus, by controlling the temperature of the RF window, these deposits can be suppressed and even avoided and the RF energy coupling from the RF antenna to the RF plasma contained in the chamber can be maintained.

FIG. 2 is a cross sectional view of the RF ion source taken along lines A-A of FIG. 1 showing RF antenna 15, RF window 30 and interior chamber 11 where RF plasma is generated. In particular, RF antenna 15 is disposed above outer RF window insulation 50 which provides an electrical insulation between RF antenna and RF window heating/electrostatic-shielding elements. The heating/RF-shielding element 20 are disposed' between the RF antenna 15 and the RF vacuum in the interior 11 of chamber 10. As a feed gas is supplied to the interior 11 of chamber 13 via an inlet port (not shown), the RF antenna 15 supplies the necessary RF power via RF window 30 to produce the desired plasma within the chamber. Multi cusp magnets 55 may be arranged on the side of the source chamber 10 to provide plasma confinement within the chamber. Extraction electrodes disposed near chamber wall 10c are used to extract the ions having the desired species from chamber 10 to form ion beam 5 incident on a downstream target substrate (not shown). Alternatively and/or in addition to heating/RF-shielding element 20, source chamber 10 may also include side heating elements 60 to further provide a source of uniform heating.

As described above, depending on the type of plasma generated, some neutrals and radicals on the RF window 30 from the plasma generated within the chamber may cause deposits to form on the RF window surface (as shown by way of example in areas 30a and 30b). For example, when using hydride gases as the feed gas, deposit layers may form at these surfaces or on spots of the RF window 30 where the temperature is comparatively low. By utilizing the heating/RF-shielding element 20 in a heater mode, the temperature of the RF window 30 may be increased which effectively suppresses or prevents these deposit formations. In this manner, deposits on the RF window are suppressed thereby providing stable source operation.

The material that comprises RF window 30 for plasma processing is typically made from alumina or quartz. The RF window is the medium through which the RF energy from antenna 15 outside the vacuum chamber is coupled to the feed gas inside the plasma chamber. Although alumina and quartz provide desirable properties for certain applications, they do have relatively low thermal conductivity and potential vacuum seal failures with chamber walls at high operating temperatures. The use of aluminum-nitride (AlN) as the RF window material provides relatively good thermal conductivity while having a similar dielectric constant to quartz or alumina. AlN can be employed in high processing temperature applications and has high electrical resistivity comparable to typical ceramic materials. In addition, AlN can be metalized and brazed to the metal walls 10a, 10b of chamber 10 while providing high-vacuum sealing properties therebetween. This avoids the need for o-ring seals which may degrade over time. This thermal conductivity between the RF window and chamber wall provides uniform heat distribution in the chamber 10 when the heater power supply 40 is activated. This uniform heat distribution suppresses deposits that may form on when a hydride gas is used as the feed gas in the RF ion source.

Figure 3:
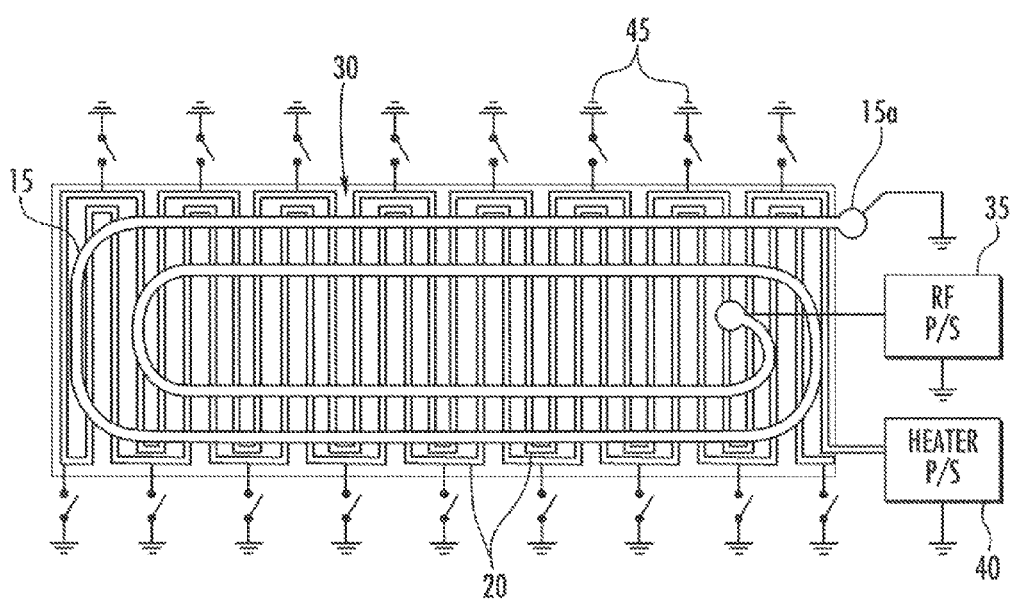
FIG. 3 is a top plan view illustrating an operating mode of RF ion source chamber in accordance with the present disclosure.
Figure 4:
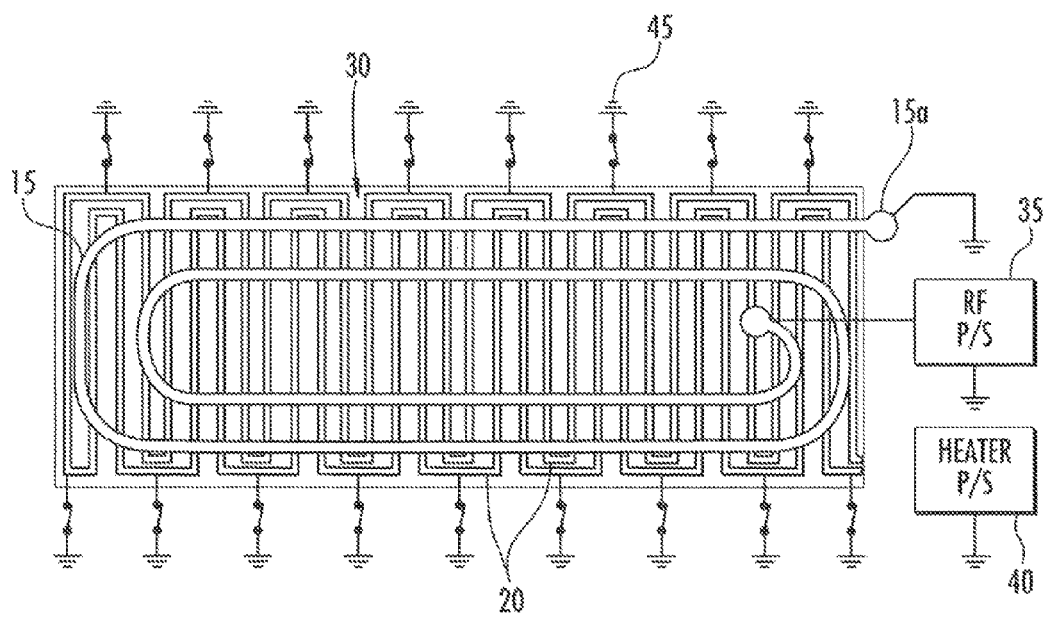
FIG. 4 is a top plan view illustrating an operating mode of RF ion source chamber in accordance with the present disclosure.

FIGS. 3 and 4 illustrate a top plan view and a functional view of two different operating modes of RF ion source chamber 10 in accordance with the present disclosure. In particular, FIG. 3 illustrates the operating mode where the heating function is turned on and end 15a of antenna 15 is connected to ground. The RF power supply 35 is connected to RF antenna 15 providing RF energy to the plasma in the interior 11 of chamber 10. The heater power supply 40 is connected to the heating/RF-shielding element 20. Each of the ground switches 45 are open. By not connecting heating/RF-shielding element 20 to ground, it allows the heating/RF shielding element 20 to have some electrical resistance proportional to the length of heating/RF-shielding element 20. Thus, the current flowing through the heating/RF-shielding element 20 produces heat based on this electrical resistance. This allows heating/RF-shielding element to act as a heater to increase the temperature of window 30 to suppress deposits thereon. This operational mode may be desirable when heavy deposition in the source chamber and/or extraction electrodes is likely, for example, when hydride gases are used as the feed gas.

FIG. 4 illustrates the operating mode where only the RF power is turned on via power supply 35 and the heating/RF-shielding element 20 acts as an RF electrostatic shield. As mentioned above, electrostatic shielding allows only inductive components to penetrate through the shielding, thus accommodating the generation of high-density plasmas in the interior 11 of chamber 10. For this mode of operation, the ground switches 45 are closed and end 15a of antenna 15 is connected to ground. This mode may be employed when less deposition is likely in the source chamber and/or extraction electrodes. This may occur, for example, when inert gases and/or fluoride gases are used as the feed gas which provide self-cleaning via sputtering and/or ion-assisted chemical etching. By utilizing a plurality of switches 45, this minimizes the electrical resistance properties of heating/RF-shielding element 20. Consequently, this allows heating/RF-shielding element 20 to act as a relatively good electrical conductor which is needed when element 20 serves as an electrostatic shield. This is in contrast to the heating/RF-shielding element 20 acting as a heater where some electrical resistance is needed to allow the current through element 20 to create heat as described above. In this manner, the heating/RF-shielding element 20 does not act as a heater, but rather as an RF electrostatic shield to allow only inductive components to penetrate through the shielding to the interior 11 of chamber 10. Thus, by utilizing the heating/RF-shielding element 20 as an RF electrostatic shield, a more stable ion source with uniform plasma generation with less sputtering is realized.

Figure 5:
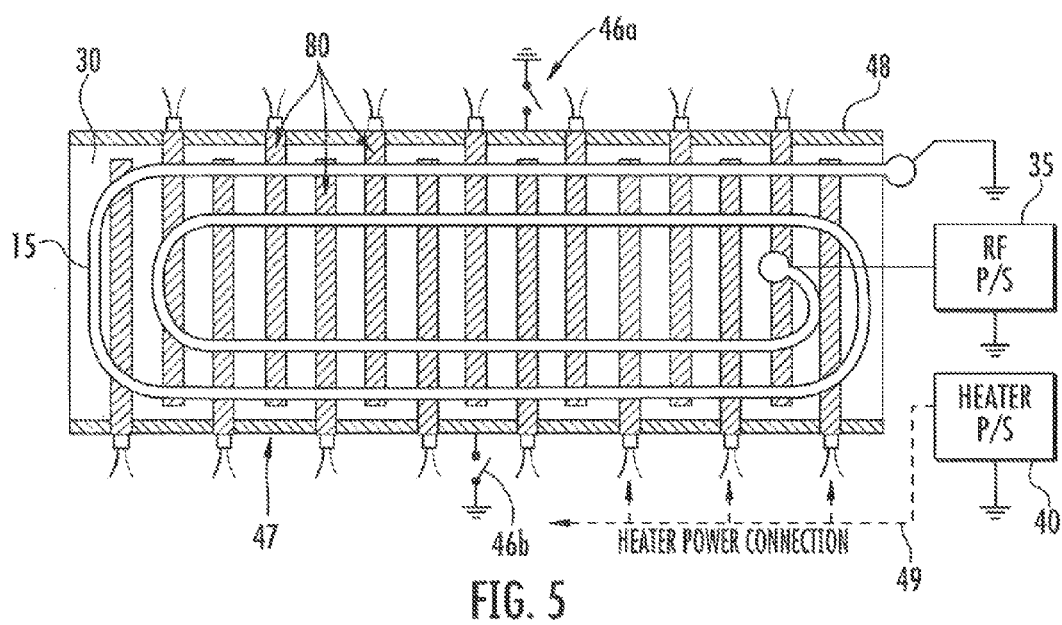
FIG. 5 is a top plan view of an alternative embodiment in accordance with the present disclosure.

FIG. 5 illustrates an alternative embodiment in accordance with the present disclosure employing sheath-type heaters 80 and ground strips 47 and 48. The heater power supply 40 is connected to each of the sheath heaters via heater power connection 49. The common ground strips 47, 48 connect the covers of the respective sheath heaters 80. Switches 46a and 46b control the connection of ground strips 47 and 48 respectively to ground. Thus, the cover of the sheath heaters (which is metal) attached to the ground strips and can be electrically floated or grounded based on the position of switches 46a, 46b. For example, the cover of the sheath heaters may be electrically floated, and the heater power supply 40 is turned off. This would typically be done when initially igniting the RF discharge via capacitive coupling of the antenna 15. Once a stable RF discharge of antenna 15 is achieved, the heater power supply 40 may be turned on and the grounding switches 46a, 46b are closed to provide both the heating function to the RF window 30 and RF shielding.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An RF ion source comprising:
a plasma chamber;
an RF antenna configured to provide RF energy to said plasma chamber;
an RF window disposed between said plasma chamber and said RF antenna, said RF window having a surface exposed to an interior of said plasma chamber;
a heating/RF-shielding element disposed between said surface of said RF window and said RF antenna, said heating/RF-shielding element having a first mode of operation configured to heat at least a portion of said RF window to suppress the formation of deposits on said surface of said RF window and a second mode of operation configured to provide an electrostatic shield for said ion source, wherein said heating/RF-shielding element comprises a cover that is electrically-conductive;
a grounding strip connected to said cover; and
extracting electrodes connected to extract ions from said plasma chamber for formation into an ion beam.

2. The RF ion source of claim 1 wherein said plasma chamber is maintained at a vacuum, said RF ion source further comprising an outer window insulator disposed between said heating/RF-shielding element and said RF antenna, said outer window insulator insulating said plasma chamber at a vacuum from ambient air.

3. The RF ion source of claim 1 further comprising a RF power supply connected to said heating/RF-shielding element.

4. The RF ion source of claim 1 further comprising a RF power supply connected to said RF antenna.

5. The RF ion source of claim 3 further comprising a plurality of switches connected to said heating/RF-shielding element, each of said switches having a first open position and a second closed position connecting said heating/RF-shielding element to ground.

6. The RF ion source of claim 5 wherein when said plurality of switches are in the first open position, an electrical resistance of said heating/RF-shielding element increases thereby allowing current flowing through said heating/RF-shielding element from said power supply to generate heat through said heating/RF-shielding element.

7. The RF ion source of claim 5 wherein when said plurality of switches are in the second closed position, an electrical resistance of said heating/RF-shielding element is minimized thereby allowing the heating/RF-shielding element to act as said electrostatic shield for the RF ion source.

8. The RF ion source of claim 1 further comprising a plurality of cusp magnets arranged on a side of the plasma chamber to provide plasma confinement within said plasma chamber.

9. The RF ion source of claim 1 wherein said heating/RF-shielding element comprises a plurality of sheath heaters.

10. The RF ion source of claim 9 wherein each of said plurality of sheath heaters includes said cover.

11. The RF ion source of claim 10 wherein said power supply is connected to each of said sheath heaters.

12. The RF ion source of claim 1 wherein the RF window is comprised of aluminum-nitride.

13. An RF ion source comprising:
a plasma chamber;
an RF antenna configured to provide RF energy to said plasma chamber;
an RF window disposed between said plasma chamber and said RF antenna, said RF window having a surface exposed to an interior of said plasma chamber;
a heating/RF-shielding element disposed between said surface of said RF window and said RF antenna, said heating/RF-shielding element having a first mode of operation configured to heat at least a portion of said RF window to suppress the formation of deposits on said surface of said RF window and a second mode of operation configured to provide an electrostatic shield for said RF ion source, said heating/RF-shielding element being surrounded by a cover that is electrically-conductive;
a grounding strip connected to said cover;
an outer window insulator disposed between said heating/RF-shielding element and said RF antenna, said outer window insulator insulating said plasma chamber at a vacuum from ambient air; and
extraction electrodes configured to extract ions from said plasma chamber for formation into an ion beam.

14. The RF ion source of claim 13 wherein the RF window is comprised of aluminum-nitride.

15. The RF ion source of claim 1 wherein said heating/RF-shielding element is disposed in a plane parallel to said RF window.

16. The RF ion source of claim 13 wherein said heating/RF-shielding element is disposed in a plane parallel to said RF window.

17. The RF ion source of claim 1 wherein said heating/RF-shielding element is configured to have a serpentine configuration.

18. The RF ion source of claim 13 wherein said heating/RF-shielding element is, configured to have a serpentine configuration.

* * * * *